US006639263B2

(12) United States Patent
Kumagai et al.

(10) Patent No.: US 6,639,263 B2
(45) Date of Patent: Oct. 28, 2003

(54) SEMICONDUCTOR DEVICE WITH COPPER WIRING CONNECTED TO STORAGE CAPACITOR

(75) Inventors: Yukihiro Kumagai, Chiyoda (JP); Hideo Miura, Koshigaya (JP); Hiroyuki Ohta, Tsuchiura (JP); Tomio Iwasaki, Tsukuba (JP); Isamu Asano, Iruma (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/255,714

(22) Filed: Sep. 27, 2002

(65) Prior Publication Data

US 2003/0030088 A1 Feb. 13, 2003

Related U.S. Application Data

(63) Continuation of application No. 09/525,029, filed on Mar. 14, 2000, now Pat. No. 6,521,932.

(30) Foreign Application Priority Data

Mar. 15, 1999 (JP) ............................................. 11-067840

(51) Int. Cl.$^7$ ....................... H01L 27/108; H01L 23/48; H01L 23/52; H01L 29/40
(52) U.S. Cl. ..................... 257/296; 257/311; 257/762
(58) Field of Search ................................ 257/296, 310, 257/311, 382, 762

(56) References Cited

U.S. PATENT DOCUMENTS 6,072,210 A    6/2000  Choi ......................... 257/303
6,130,449 A *  10/2000 Matsuoka et al. ........... 257/296
6,255,151 B1   7/2001  Fukuda et al. ............... 438/197
6,255,157 B1   7/2001  Hsu et al. ................... 438/239
2002/0011618 A1 * 1/2002 Ishibashi et al. ............ 257/301
2002/0014646 A1 * 2/2002 Tsu et al. .................... 257/296
2002/0187633 A1 * 12/2002 Akram ........................ 438/652

FOREIGN PATENT DOCUMENTS

JP    5-90606    4/1993
JP    6-504408   5/1994
JP    8-69980    3/1996
JP    10-12839   1/1998
JP    10-229084  8/1998
JP    10-270667  10/1998
JP    10-321816  12/1998

OTHER PUBLICATIONS

Nikkei Microdevice (pp. 74–77) Jun. issue in 1992.

* cited by examiner

Primary Examiner—Ngân V. Ngô
(74) Attorney, Agent, or Firm—Antonelli, Terry, Stout & Kraus, LLP (57) ABSTRACT

It is an object of the present invention to provide a high-reliability semiconductor device having a storage capacitor and wiring using copper for a main conductive film. Under the above object, the present invention provides a semiconductor device comprising: a semiconductor substrate; a storage capacitor formed on the main surface side of the semiconductor substrate and being a first electrode and a second electrode arranged so as to put a capacitor insulation film; a wiring conductor formed on the main surface side of the semiconductor substrate and including the copper (Cu) element; and a first film formed on the surface of the wiring conductor; wherein a material configuring the first film and a material configuring the first electrode and/or the second electrode include the same element.

15 Claims, 6 Drawing Sheets

SEMICONDUCTOR DEVICE WITH COPPER WIRING CONNECTED TO STORAGE CAPACITOR

This is a continuation of application Ser. No. 09/525,029, filed Mar. 14, 2000, now U.S. Pat. No. 6,521,932 the entire disclosure of which is hereby incorporated by reference.

TECHNICAL FIELD

The present invention relates to a semiconductor device, particularly to a semiconductor device having a storage capacitor and wiring including the copper element, which improves reliability and reduces manufacturing processes.

BACKGROUND OF THE INVENTION

According to recent developments of information and communication apparatus, a semiconductor device such as a DRAM (Dynamic Random Access Memory) has required higher integration and higher accumulation for semiconductor elements (hereafter referred as an element) therein. Then, as an element has been further fined, various problems have also occurred. One of the problems on a DRAM is reduction of a storage capacitance. Because the capacitance of an element is proportional to its area, if the shape of an element was made smaller simply, the capacitance decreases in proportion to the square of a machining dimension. In case that a storage capacitance of a DRAM decreases, power consumption increases and reliability deteriorates since the refreshing is frequently required for compensating disappearance of electric charges. Therefore, even if an element is fined, it is necessary to keep a storage capacitance at a certain or higher level. Up to a 16-Mbit DRAM, the reduction of the capacitance owing to the fining of an element is compensated by making an oxide film forming a capacitor thin, and then the oxide film thickness is approximately 10 nm at present. However, because the thickness of the capacitor insulation film almost reaches the limit, materials having higher dielectric constant has been developed as a capacitor insulation film for a high integration memory of 64-Mbit or more. Then, tantalum oxide ($Ta_2O_5$) is studied for 64 to 256-Mbit, and barium strontium titanate ((Ba, Sr)$TiO_3$: BST) and Pb zirconate titanate (Pb(Zr, Ti)$O_3$:PZT) are studied for a 1-Gbit DRAM.

Furthermore, it is necessary to pay attention to selection of an electrode material in the development of the materials configuring the capacitor insulation film. The reason is that when forming a BST or PZT film on a conventionally-used Si electrode, the electrode film is oxidized, and a dielectric film other than the BST or PZT film is formed since a BST and PZT film require high temperature and oxidation atmosphere for forming them. The insulation film formed by oxidation of an electrode film causes a problem that a designed capacitance cannot be secured. Therefore, noble metals such as platinum (Pt), ruthenium (Ru), iridium (Ir), and palladium (Pd), or ruthenium oxide superior in oxidation resistance and heat resistance are studied as materials capable of withstanding various atmospheres for forming a BST and PZT film. Moreover, since PZT is used as a capacitor insulation film not only for a DRAM but also for a FRAM (Ferroelectric Random Access Memory), Pt, Ru, Ir, Pd, $RuO_2$, and $IrO_2$ are studied as electrode materials.

A throughput required for a semiconductor device has been severer year by year and thus, a signal delay is a problem for a device using wiring in which aluminum (Al) is used for a main conductive film. As an alternative wiring conductor to the Al wiring conductor, a wiring conductor which includes copper (Cu) having a lower electric resistance than that of Al as a main conductive film is studied. However, Cu may diffuse in a silicon oxide and thus, may deteriorate performances of a transistor.

Therefore, a barrier metal is necessary to prevent Cu from diffusing, and refractory metals such as TiN, tungsten (W), and tantalum (Ta) are studied as the barrier metal, as described in, for example, NIKKEI MICRODEVICE (pages 74 to 77 on the June issue in 1992).

Wiring using copper (Cu) for a main conductive film (hereafter referred as Cu wiring) as described in the above denotes a wiring film including the copper (Cu) element of which content is higher than contents of the other included elements.

SUMMARY OF THE INVENTION

As described above, various materials are studied on each factor configuring elements of a DRAM with improvement of integration and functions thereof. In case of developing a DRAM device, it is important to select out the material which is superior in electrical and mechanical reliabilities and can be manufactured at a low cost compared with the proposed materials. Then, the optimum materials are generally determined for respective factors.

However, if optimum materials are selected for respective factors, different materials are connected with each other at an electrical joint point between them, and thereby a problem occurs that electrical resistance increases. In case of a semiconductor device having a storage capacitor and Cu wiring, if trying to connect a plug including Cu to an extended portion of an upper electrode of the storage capacitor, the problem occurs that contact resistance increases since, for example, Ru serving as the upper electrode of the storage capacitor contacts with, for example, TiN serving as a barrier metal of the Cu wiring at the joint point and thus the different materials contact with each other.

Moreover, resistance against electromigration is deteriorated at the interface between different materials. A design rule of a DRAM has determined a dimension of 0.35 micron for a 64-Mbit DRAM. However, in case that an operation speed and integration of a device are further improved in future, it is estimated that the design rule determines a dimension of 0.25 micron for a 256-Mbit DRAM, and 0.16 micron as further fined for a 1-Gbit DRAM. Naturally, the fining at the above joint point will be further advanced and thus, it is worried that the occurrence of a void due to electromigration or disconnection becomes obvious.

Furthermore, with an aspect ratio of a plug increases, the problem occurs that a barrier metal film is not completely formed on the bottom of a contact hole. The aspect ratio of the plug is further increased as a result of making a storage capacitor structure a three-dimensionally configuration for maintaining a capacitance. As a result, it is difficult to form a barrier-metal film up to the bottom of the contact hole.

Moreover, in recent years, developments of not only a single DRAM but also a semiconductor device configured by incorporating a memory into a logic circuit, which is referred as a DRAM-consolidated logic, is advanced, and process consistency between a logic manufacturing process for mainly manufacturing a transistor and a wiring conductor connecting the transistor, and a DRAM manufacturing process for manufacturing a storage capacitor in addition to the transistor and the wiring conductor. Conventionally, a electrode film forming process of a storage capacitor, and a barrier metal film forming process for Cu wiring are different from each other since different materials are used in those processes, and as a result, it leads to high manufacturing costs.

As described above, introduction of new materials is studied for a storage capacitance and wiring of a semiconductor device such as a DRAM together with the improvement of integration and functions of an element. However, it is worried to increase contact resistance of a joint point between new different materials, to reduce electromigration resistance, to increase a manufacturing cost, and to deteriorate reliability due to introduction of a new manufacturing system or modification of a manufacturing process. Moreover, in case of a DRAM-consolidated logic having a memory circuit and a logic circuit, the consistency between a DRAM manufacturing process and a logic manufacturing process is required.

It is a first object of the present invention to provide a semiconductor device having high reliability. It is a second object of the present invention to provide a semiconductor device lowered in manufacturing costs. It is a third object of the present invention to provide a semiconductor device realizing low contact resistance at a joint point between a material of a storage capacitor electrode and a material of a Cu wiring barrier metal by adopting optimum electrode material and optimum barrier metal material. It is a fourth object to provide a semiconductor device not easily causing a void or disconnection due to electromigration. It is a fifth object of the present invention to provide a semiconductor device capable of forming a Cu wiring film even if a thickness of a barrier metal film is not uniform when forming the Cu wiring film. It is a sixth object of the present invention to provide a semiconductor device making it possible to form a storage capacitor electrode film and a Cu wiring barrier metal film in the same process.

The present inventor et al. performed computer simulation about ruthenium (Ru), platinum (Pt), and iridium (Ir) studied as electrode materials of a storage capacitor in accordance with the molecular dynamics method, evaluated the adhesion with copper, and studied a possibility as a barrier metal for copper wiring. As a result of analysis, it is clarified that peel strengths of ruthenium, platinum, or iridium films are improved as compared to a case of using a conventional titanium nitride (TiN) film, tungsten (W) film, or tantalum (Ta) film as a barrier metal for copper (Cu) wiring because lengths of the unit-crystal-lattice of ruthenium, platinum, and iridium are comparatively close to that of copper. That is, they clarify that each of ruthenium, platinum, and iridium can be used as a barrier metal for copper wiring.

Moreover, according to the computer simulation analysis performed by the present inventor et al., it is clarified that a peel strength of a film against a silicon oxide film is further improved by adding a transition metal such as palladium (Pd) or titanium (Ti) to Ru, Pt, or Ir. Furthermore, they clarify that a peel strength of a film against a silicon oxide film is improved by using conductive oxide such as ruthenium oxide or iridium oxide.

Moreover, they find that it is possible to provide a high reliability semiconductor device which has a low contact resistance at a joint point between the above upper electrode and the wiring barrier metal, and is superior in migration resistance without deteriorating any functions requested for each film by using the same material for the upper electrode and the barrier metal and by using any one of Ru, Pt, and Ir for the materials in a semiconductor device having a storage capacitor and wiring using copper or a copper alloy for a main conductive film.

Moreover, they find that it is possible to provide a high reliability semiconductor device simplifying a manufacturing process without deteriorating functions requested for each film by using the same material for at least one electrode of a storage capacitor and for a copper wiring barrier metal and by using any one of Ru, Pt, and Ir for the materials in a semiconductor device having the storage capacitor and wiring using copper or a copper alloy for a main conductive film.

Furthermore, they find that it is possible to provide a higher reliability semiconductor device by using Ru, Pt, Ir, ruthenium oxide, or iridium oxide to which at least one of the elements Pd, Ti, Ni, and Co is added for a storage capacitor electrode and a Cu wiring barrier metal in a semiconductor device having a storage capacitor and wiring using copper or a copper alloy for a main conductive film.

A conventional semiconductor device has been developed for each factor such as a storage capacitor or a wiring conductor, and an optimum material has been selected for each factor. Noble metals such as Pt, Ru, Ir and Pd or conductive oxides such as ruthenium oxide and iridium oxide are listed as prospective materials of a storage capacitor electrode film. Moreover, TiN, tungsten (W), and tantalum (Ta) are studied as Cu wiring barrier metals. However, a storage capacitor upper electrode and a wiring barrier metal have electrical connecting portion where contact between different materials is forcibly made.

In case of connection between different materials, a resistance value increases at the connection interface. The trend in semiconductor device developments is oriented in the direction of low power consumption and thus high contact resistance becomes obstruction on the manufacturing of a semiconductor device. Moreover, a memory cell is further fined together with improvements of integration degree, a plug diameter is decreased, and a joint point area between a plug and an upper electrode extended portion is decreased. At this portion serving as a different-material contact interface, it is worried that a void or disconnection occurs due to electromigration.

From the viewpoint that unification of materials is necessary to improve electrical and mechanical reliabilities, the present inventor et al. find that a semiconductor which can be manufactured without deteriorating functions of each film is obtained by selecting suitable materials from many combinations.

The present inventor et al. performed computer simulation about noble metal elements such as ruthenium, platinum and iridium studied as storage capacitor electrode materials in accordance with the molecular dynamics method so as to evaluate the adhesion with copper, and study a possibility as a barrier metal for copper wiring. As a result of analysis, they clarify that, because unit-crystal-lattice lengths of ruthenium, platinum, and iridium are comparatively close to that of copper, so that peel strengths of ruthenium, platinum, and iridium films are improved compared to those of conventional titanium nitride, tungsten, and tantalum films.

Figure 2:
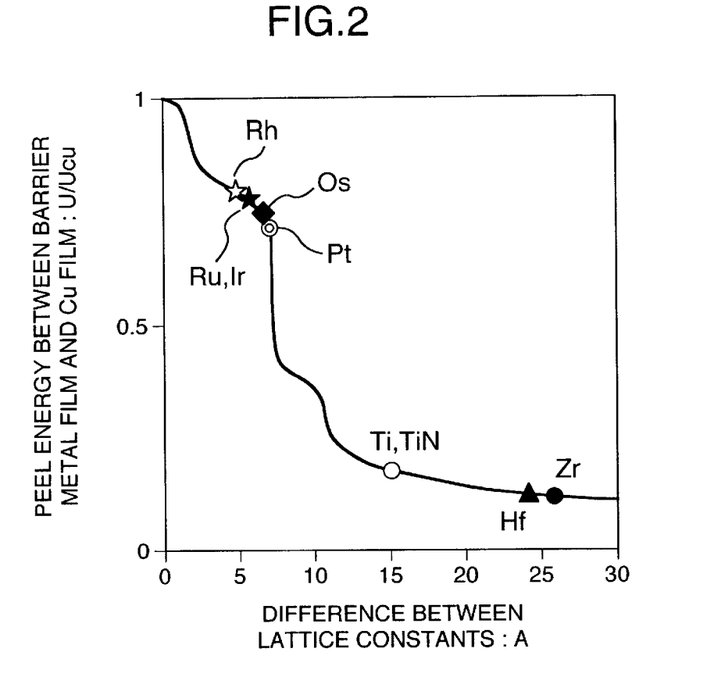
FIG. 2 is an illustration showing analysis results of adhesions between copper and a barrier metal according to a molecular dynamics method.

FIG. 2 shows a result of an analysis of evaluation regarding the adhesion with a copper thin film of films made of materials studied as barrier metals. The horizontal axis in FIG. 2 shows a difference $(|a_p - a_n|/a_p) \times 100 = A\ (\%)$ between a minor side $a_n$ of a unit rectangular lattice on a close-packed-crystal plane configured by the main element of a barrier metal and a minor side $a_p$ of a unit rectangular lattice on a close-packed-crystal plane configured by the copper element, and shows a degree of lattice mismatching between a barrier metal material and copper. Moreover, the vertical axis in FIG. 2 shows energy U obtained by subtracting the entire energy of a system under a state in which a barrier metal sufficiently separates from a copper thin film from the entire energy of a system under a state in which the barrier metal has a contact interface on the copper thin film, and shows a value corresponding to a peel strength of the film. In this case, $U_{Cu}$ denotes peel energy between copper and copper. From FIG. 2, it is found that adhesions of ruthenium, platinum, and iridium films with a copper film are improved compared to those of conventional titanium nitride, tungsten, and tantalum films. Moreover, as a result of analysis, it is clarified that melting points of ruthenium, platinum, and iridium are higher enough than the melting point of copper and diffusion of copper can be restrained. That is, it is clarified that each of ruthenium, platinum, and iridium completely functions as a copper wiring barrier metal.

Moreover, the present inventor et al. studied a possibility as a barrier metal about palladium which is a noble metal element studied as the same storage capacitor electrode material. However, it is clarified that the melting point of palladium is the lowest among noble metals compared to ruthenium, platinum, and iridium, the adhesion of palladium with copper is deteriorated, and thus palladium is inferior in barrier property against copper.

As a result, the present inventor et al. clarify that each of Ru, Pt, and Ir is a material usable for a storage capacitor electrode material and a copper wiring barrier metal.

Figure 3:
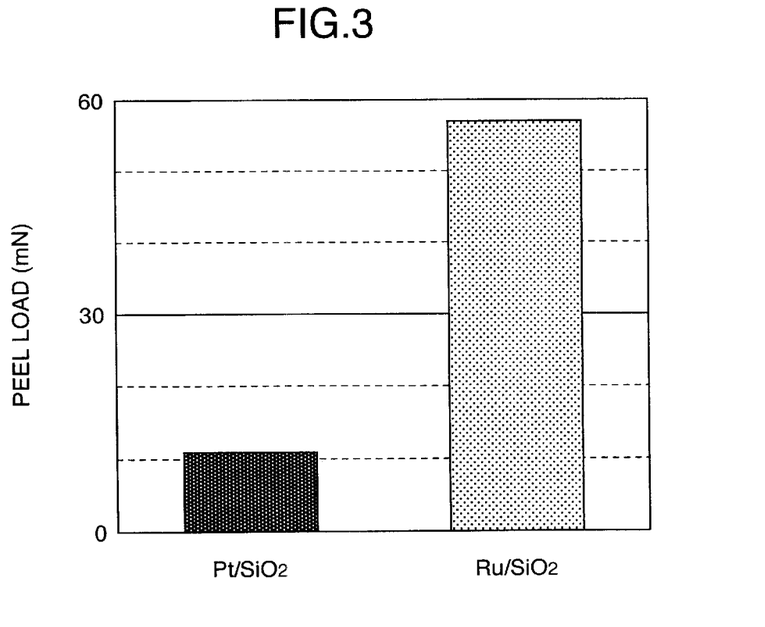
FIG. 3 is an illustration showing experiment results of adhesions between a platinum film and a ruthenium film, and a silicon oxide film according to the scratch test method.

A storage capacitor and a wiring conductor are formed on an interlayer insulator film made of a silicon oxide film. Therefore, a peel strength from a silicon oxide film is requested for a storage capacitor and a wiring conductor. FIG. 3 shows results of measuring peel strengths of a ruthenium film and a platinum film with a silicon oxide film according to the scratch test method. The peel load of the vertical axis in FIG. 3 is a value corresponding to a peel strength of a film. A peel strength requested for a film depends on a manufacturing process or an element structure. However, as a result of experiments, it is clarified that film adhesions of a ruthenium film and a platinum film with a silicon oxide film are different from each other and adhesion of a ruthenium film is stronger than adhesion of a platinum film.

Then, the present inventor et al. further performed study and analysis through molecular dynamics simulation in order to obtain a higher reliability film. As a result, they clarify that the adhesion with a silicon oxide film is further improved by adding at least one of the elements palladium (Pd), cobalt (Co), nickel (Ni), and titanium (Ti) to Ru, Pt, or Ir.

Figure 4:
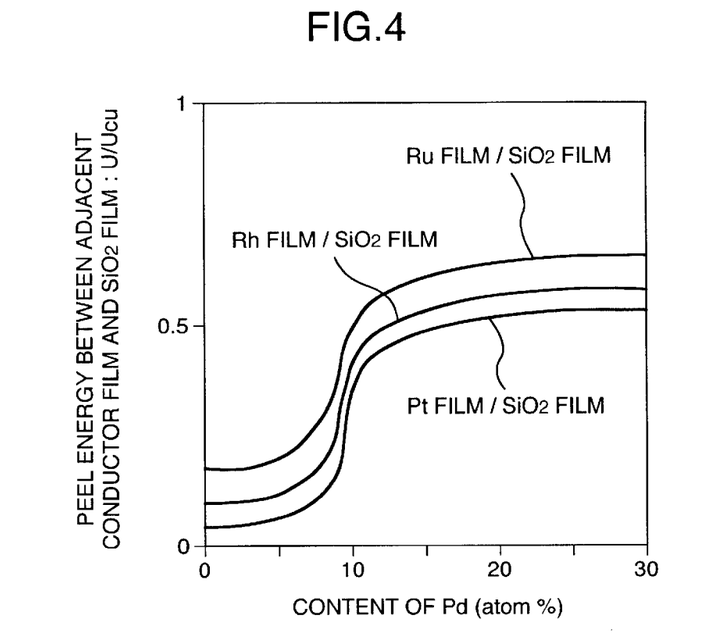
FIG. 4 is an illustration showing the impurity content dependency of adhesion between an electrode film and a silicon oxide film according to the molecular dynamics method.

FIG. 4 shows dependencies according to an additional-element content to Ru, Pt, and Ir regarding film peel strengths from a silicon oxide film. The horizontal axis in FIG. 4 shows a quantity of palladium (Pd) to be added to a main component element when using palladium (Pd) as an additional element and the vertical axis shows peel energy from the silicon oxide film, which is a value corresponding to a peel strength. From FIG. 4, it is clarified that a peel strength from a silicon oxide film increases from the time when an additional-element content of approximate 10 at. % is added. Moreover, in the case of ruthenium oxide and iridium oxide, adhesions of their films with the silicon-oxide film are increased.

Furthermore, addition of an impurity element to Ru, Pt, or Ir produces another effect. A stress produced in a film formation step may cause peeling of a film or deterioration of an element characteristic. After forming a Ru, Pt, or Ir film, a large stress is produced. The large stress may remain in a film depending on an element structure and the remaining stress may cause a defect. That is, it is preferable that a film to be formed is of a low stress.

Figure 5:
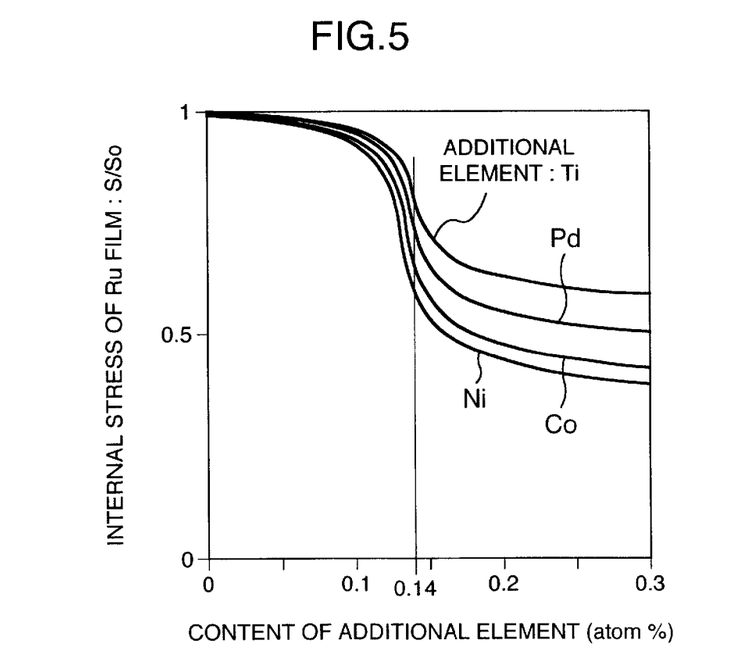
FIG. 5 is an illustration showing analysis results of the impurity content dependency of a ruthenium film stress according to the molecular dynamics method.

The present inventor et al. clarify that it is possible to moderate a film stress by adding a material having a melting point lower than that of a noble metal element such as Ru, Pt, or Ir to a Ru, Pt, or Ir film through molecular dynamics simulation. FIG. 5 is an illustration showing changes of internal stresses S remaining in a Ru film according to additional-element contents when performing computer simulation of forming films including palladium (Pd), cobalt (Co), nickel (Ni), and titanium (Ti) on an $SiO_2$ substrate at 900 K and cooling them up to 300 K. $S_0$ shows an internal stress when including no additional element. From FIG. 5, it is found that an internal stress is decreased when an additional-element content is approximate 0.14 at. % or more.

When an additional-element content exceeds approximate 25 at. %, an atomic arrangement of a main material is disordered. Therefore, it is preferable to set the additional-element content to approximate 25 at. % or less.

As a result, they clarify that a semiconductor device further superior in mechanical reliability is obtained by adding at least one of the elements Pd, Ti, Ni, and Co to Ru, Pt, or Ir by 0.14 to 25 at. % as a storage capacitor electrode film and a Cu wiring barrier metal.

Problems of the present invention can be solved by the following configurations.

(1): A semiconductor device comprising a semiconductor substrate; a storage capacitor formed on the main surface side of the semiconductor substrate and being provided with a first electrode and a second electrode arranged so as to put a capacitor insulation film between them; a wiring conductor formed on the main surface side of the semiconductor substrate and including the copper (Cu) element; and a first film formed on the surface of the wiring conductor, wherein a material configuring the first film and a material configuring the first electrode and/or the second electrode include the same element.

(2): A semiconductor device comprising a silicon substrate; a storage capacitor formed on the main surface side of the silicon substrate and being provided with an upper electrode and a lower electrode arranged so as to put a capacitor insulation film between them; a wiring conductor formed on the main surface side of the silicon substrate and including copper (Cu) as the main element; and a barrier metal provided so as to contact with the surface of the wiring conductor, wherein the main element of a material configuring the barrier metal is the same as the main element of a material configuring the upper electrode and/or the lower electrode.

The main element of a material represents an element having the highest content percentage among all elements included in the material.

(3): A semiconductor device comprising a semiconductor substrate; a storage capacitor formed on the main surface side of the semiconductor substrate and being provided with an upper electrode and a lower electrode arranged so as to put a capacitor insulation film between them; a wiring conductor formed on the main surface side of the semiconductor substrate and including copper (Cu) as the main element; and a barrier metal provided so as to contact with the surface of the wiring conductor, wherein the upper electrode extends over an area in which the lower opposing electrode exists; the main element of a material configuring the barrier metal is the same as the main element of a material configuring the upper electrode; and the barrier metal contacts with the upper electrode in an upper electrode extending area out of the opposing lower electrode existing area.

(4): A semiconductor device comprising a semiconductor substrate; a storage capacitor formed on the main surface side of the semiconductor substrate and being provided with a first electrode and a second electrode arranged so as to put a capacitor insulation film between them; a wiring conductor formed on the main surface side of the semiconductor substrate and including the copper (Cu) element; a barrier metal provided so as to contact with the surface of the wiring conductor; wherein the shortest distance between the semiconductor substrate and the first electrode is shorter than the shortest distance between the semiconductor substrate and the second electrode; the second electrode extends over an area in which the opposing first electrode exists; the main element of a material configuring the barrier metal is the same as the main element of a material configuring the second electrode; and the wiring conductor contacts with the second electrode in an second electrode extending area out of the opposing first electrode existing area.

(5): In the above Item (2), the main element of the materials configuring the barrier metal and the upper electrode and/or the lower electrode is selected from the group consisting of ruthenium, platinum and iridium.

(6) In the above Item, the main element of the materials configuring the barrier metal and the upper electrode and/or the lower electrode is selected from the group consisting of ruthenium, platinum and iridium, and the material configuring the barrier metal and the material configuring the upper electrode include at least one type of element selected from the group of palladium, titanium, nickel, and cobalt, the sum content of the selected elements being not less than 0.14 but not more than 25 at. %.

(7): In the above Item (1), the capacitor insulation film is configured by a metal selected from the group of strontium titanate ($SrTiO_3$), barium strontium titanate ($(Ba, Sr)TiO_3$: BST), lead zirconate titanate ($Pb(Zr, Ti)O_3$: PZT) and bismuth layered compound (SBT).

(8): A method for manufacturing a semiconductor device comprises the following steps of:

forming an element on the main surface side of a silicon substrate;

forming an interlayer insulator film on the main surface side of the silicon substrate after the element forming step;

forming a first hole for forming a storage capacitor of a memory section and a second hole for forming a wiring conductor and a plug of a logic section, in the interlayer insulator film;

forming a first film on the side surfaces in the first hole and the second hole;

forming the wiring film and the plug film in the second hole after the first film forming step;

forming a dielectric film in the first hole after the first film forming step; and forming a second film on the dielectric film and on the wiring conductor after the dielectric film forming step.

(9): In the method for manufacturing a semiconductor device in the above Item (8), the main element of the first film and the second film are selected from the group consisting of ruthenium, platinum, and iridium.

The present inventor et al. examined prior arts about storage capacitor electrodes and wiring materials in accordance with the result of the invention. However, they did not find a storage capacitor electrode and a Cu wiring barrier metal made of the same material selected from Ru, Pt, Ir ruthenium oxide, and iridium oxide. It is disclosed to use Pt, Ru, or Ir as a storage-capacitor electrode material in JP-A-5-90606, 10-321816, 10-270667, 10-12839 and so on. Moreover, it is disclosed to use Pt, Ru, or Ir as a Cu wiring barrier metal in JP-A-10-229084, 8-69980 and so on. However, in the above prior arts, there is no description for suggesting the use of the same material selected from Ru, Pt, Ir ruthenium oxide, or iridium oxide for a storage capacitor electrode and a Cu wiring barrier metal.

DESCRIPTION OF THE PREFERRED EMBODIMENTS

The first embodiment of the present invention will be described below by referring to FIGS. 1 to 5.

Figure 1:
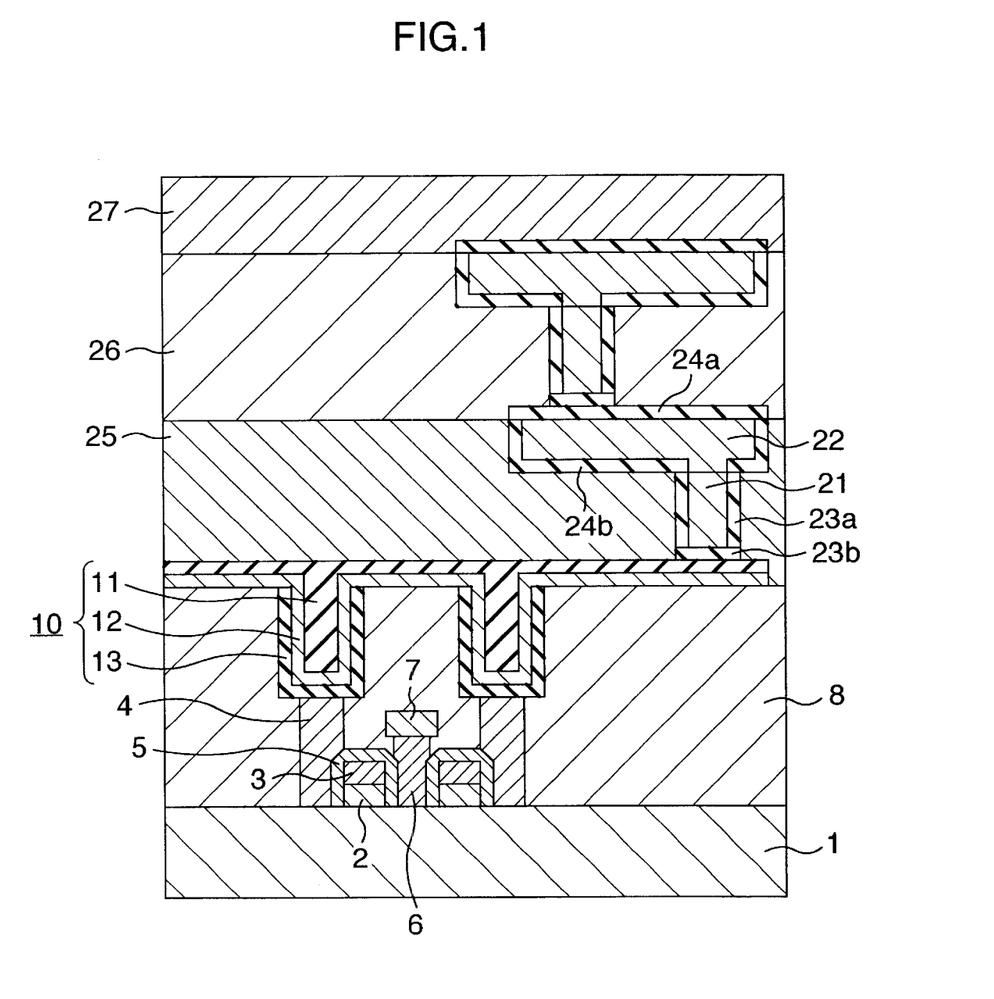
FIG. 1 is a schematic view showing a cross section of the semiconductor device of a first embodiment according to the present invention.

FIG. 1 shows a schematic view of a cross section of a memory section of the semiconductor device of this embodiment, FIG. 2 shows analysis results of the adhesion between copper and barrier metal according to the molecular dynamics method, FIG. 3 shows evaluation results of adhesions of a Pt film and a Ru film with a silicon-oxide film according to the scratch test method, FIG. 4 shows the impurity-content dependency of the adhesion of an electrode film with a silicon-oxide film according to the molecular dynamics method, and FIG. 5 shows the impurity-content dependency of a Ru film stress.

As shown in FIG. 1, the semiconductor device of this embodiment is configured by a transistor formed on a main plane of a silicon substrate 1, a storage capacitor 10 electrically connected to the transistor, and a wiring conductor 22 for forming a circuit by electrically connecting these memory cells.

The transistor is configured by a gate oxide film 2, a gate electrode 3, and a diffusion layer (source and drain areas: not illustrated) and each component is electrically insulated by an isolation film (not illustrated). The gate oxide film 2 comprises a dielectric film such as a silicon-oxide film or a silicon-nitride film or a laminated structure of the silicon-oxide film and the silicon-nitride film. Moreover, the gate electrode 3 comprises a polycrystal silicon film, a metallic film, or a metal silicide film, or a laminated structure of the polycrystal silicon film, metallic film, and metal silicide film, for example. A silicon-oxide film 5 is formed on the upside and the side wall of the gate oxide film 3. Moreover, a bit line 7 is connected through a contact plug 6. The entire upside of the transistor is covered with an interlayer insulator film 8 made of a BPSG (Boron-doped Phospho Silicate Glass) film, a SOG (Spin On Glass) film, or a TEOS (Tetra-Ethyl-Ortho-Silicate) film, or a silicon-oxide film or a nitride film formed through the chemical vapor deposition method or sputtering method.

A storage capacitor 10 is formed on the other side of the diffusion layer (not illustrated) of the transistor through a contact plug 4 made of polycrystal silicon. The storage capacitor 10 comprises a laminated structure of a lower electrode 13, a dielectric film 12, and an upper electrode 11. However, the storage capacitor 10 can be a laminated structure formed by adding a conductive film such as a titanium nitride (TiN) film to the lower electrode 13, dielectric film 12, and upper electrode 11. In this case, the upper electrode 11 is formed up to an area having no faced electrode (lower electrode 13). Moreover, the dielectric film 12 comprises a high dielectric material, or ferroelectric material such as one of (Ba, Sr)TiO$_3$ (BST), PbTiO$_3$, PbLaTiO$_3$, BaTiO$_3$, SrTiO$_3$, or Pb(Zr, Ti)O$_3$ (PZT), and films of these substances are formed through the sputtering method, the chemical vapor deposition method, or the laser ablation method. Furthermore, a storage-capacitor structure can be a structure in which a storage capacitor is formed inside of a cylindrical hole, a structure of a parallel-plate storage capacitor, a structure in which the outside of a cylinder is formed into a storage capacitor, or a structure in which inner wall and outer wall of a cylinder serve as a storage capacitor. Furthermore, portions other than the storage capacitor 10 are covered with the interlayer insulator film 8.

An interlayer insulator film 25 is formed on the storage capacitor 10, and a plug 21 covered with barrier metals 23$a$ and 23$b$ is formed in a contact hole formed on the film 25 and connected to the upper electrode 13 of the storage capacitor 10. The wiring conductor 22 covered with barrier metals 24$a$ and 24$b$ is formed through the plug 21. The plug 21 and the wiring conductor 22 are made of Cu or a Cu alloy and formed into a film through the plating method, sputtering method, or chemical vapor deposition method. Moreover, the interlayer insulator film 25 may be made of the same material as the interlayer insulator film 8.

A plurality of wiring layers comprising the wiring conductor 22, plug 21, the barrier metals 23$a$, 23$b$, 24$a$, and 24$b$, and the interlayer insulator film 25 are formed so that they are electrically connected each other, a portion to be electrically connected with an external unit is formed on the wiring layers, and then the wiring layers are covered with a protective film 27.

In case of this embodiment, the upper electrode 11 and the barrier metals 23 and 24 are characterized that the same element is used for each main component. Specifically, the electrode 11 and the barrier metals 23 and 24 are respectively made of one of ruthenium (Ru), platinum (Pt), and iridium (Ir), or an alloy obtained by adding palladium (Pd), cobalt (Co), nickel (Ni), or titanium (Ti) to their noble metal elements by 0.14 at. % or more, or ruthenium oxide or iridium oxide. Moreover, these elements are formed into films through the sputtering method, the chemical vapor deposition method, or the vacuum evaporation method.

As shown in FIG. 1, the semiconductor device of this embodiment uses the same material for the upper electrode 11 and the barrier metals 23$a$, 23$b$, 24$a$, and 24$b$, and the same material includes one of Ru, Pt, and Ir, an alloy obtained by adding transition metals such as Pd, Co, Ni, and Ti to these noble metal elements, or ruthenium oxide or iridium oxide. Therefore, an advantage is obtained that a contact resistance can be decreased at the contact interface between a storage capacitor and a wiring conductor without deteriorating functions requested for each film.

Moreover, at the contact interface, same materials contact with each other. Therefore, an interface superior in electromigration resistance is obtained, and the advantage is obtained that it is possible to prevent a void and disconnection due to electromigration.

Furthermore, at the above contact interface, each contact portion of the upper electrode 11 and the barrier metals 23$a$ and 23$b$ is made of the same type of material. Thus, it produces the effect that a preferable film adhesion is obtained.

Furthermore, even if an aspect ratio of a contact hole increases, the material used for the upper electrode 11 functions as a barrier metal. Therefore, the advantage is obtained that it can be unnecessary that the barrier metal 23$b$ at the bottom of the contact hole is formed as a complete film.

Furthermore, by adding transition metals such as Pd, CO, Ni, and Ti to Ru, Pt, or Ir, an advantage is obtained that the adhesion with a silicon-oxide film is further improved.

Furthermore, by adding transition metals such as Pd, CO, Ni, and Ti to Ru, Pt, or Ir, an advantage is obtained that it is possible to reduce a film stress.

Furthermore, by using the same material for a storage capacitor electrode and a wiring barrier metal, it is possible to reduce the material cost and moreover reduce the manufacturing cost because film forming systems are unified.

The wiring conductor 22 and plug 21 of the semiconductor device of this embodiment using Cu or a Cu alloy for a main conductive film are covered with a barrier metal. However, it is not always necessary to cover the entire surface. For example, it can be unnecessary to form the barrier metal 24$a$. Moreover, because the semiconductor device of this embodiment is referred only to the upper electrode 11 of the storage capacitor 10 and the barrier metal 23 of the Cu-wiring plug 21, the configurations of the other portion may be configurations other than those of this embodiment.

Figure 6:
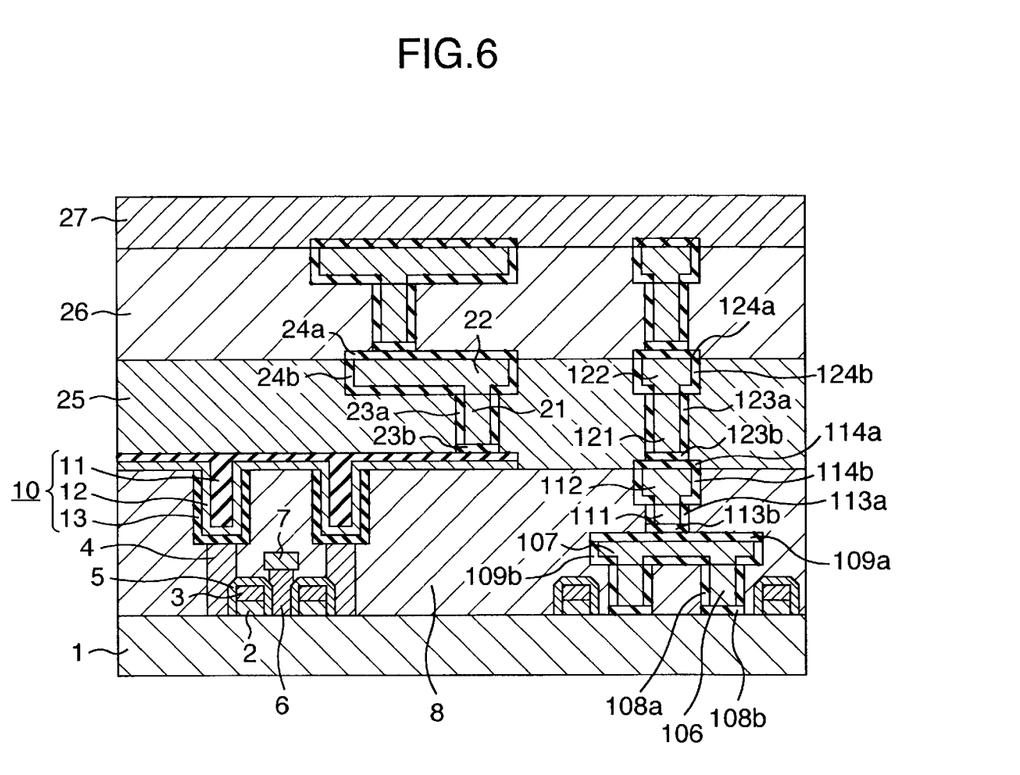
FIG. 6 is a schematic view showing a cross section of the semiconductor device of a second embodiment according to the present invention.
Figure 7A:
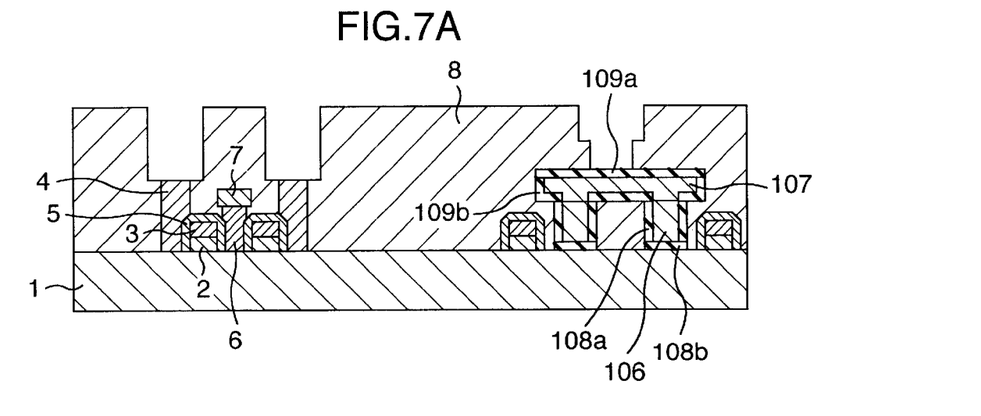
FIGS. 7A to 7C are schematic views showing some steps of manufacturing process of the semiconductor device of the second embodiment according to the present invention.
Figure 7B:
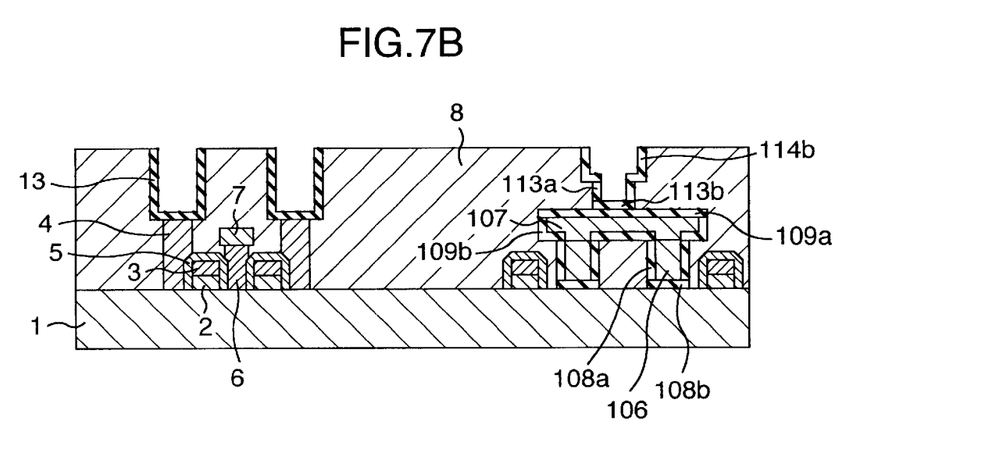
Figure 7C:
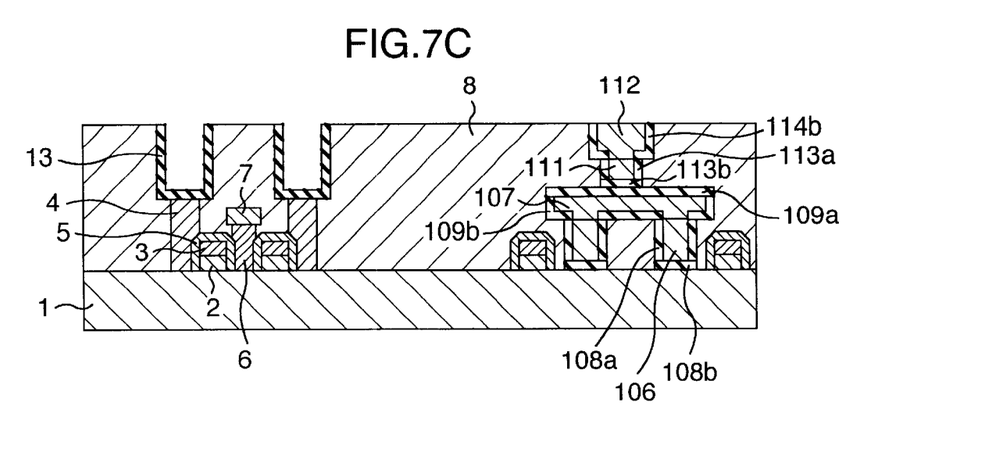
Figure 8A:
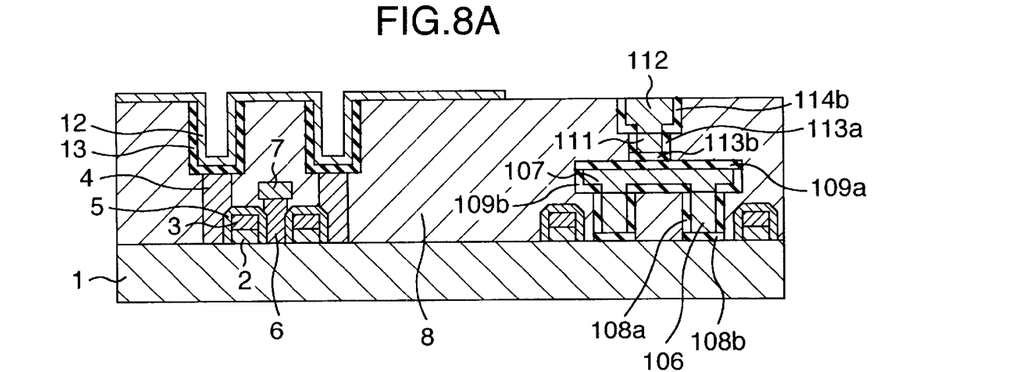
FIGS. 8A to 8C are schematic views showing some steps of manufacturing process of the semiconductor device of the second embodiment according to the present invention.
Figure 8B:
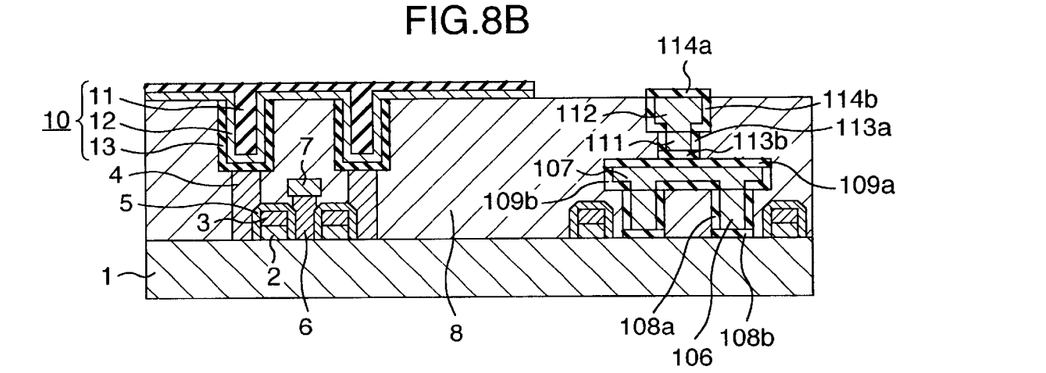
Figure 8C:
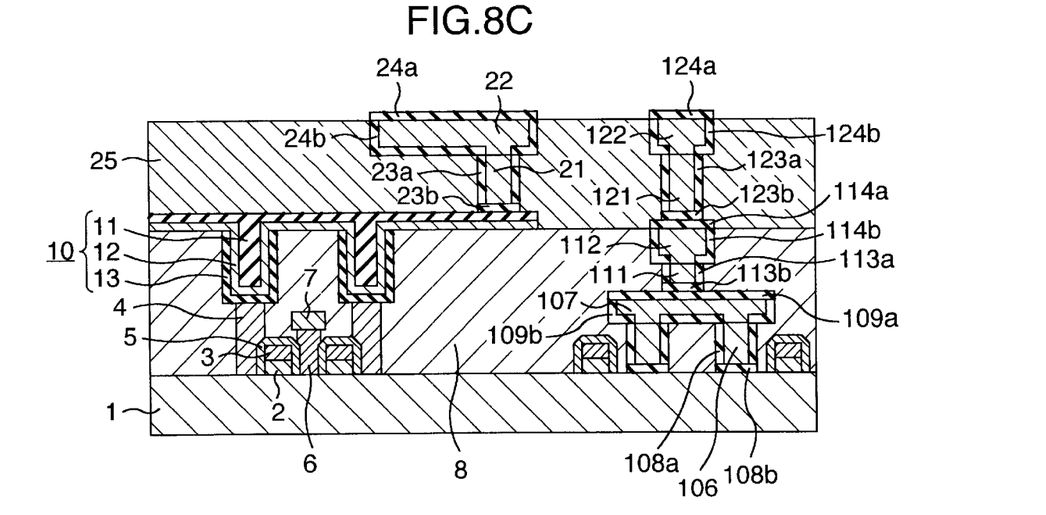

Then, a second embodiment of the present invention will be described below by referring to FIGS. 6 to 8. FIG. 6 is a sectional view of an internal structure including a memory section and a logic section of the semiconductor device of this embodiment, and FIGS. 7 and 8 are schematic diagrams showing manufacturing steps of the semiconductor device of this embodiment.

FIG. 6 shows a main sectional structure of the semiconductor device of this embodiment. The second embodiment is different from the first embodiment in that a logic section (portions represented by symbols 107 to 114) formed at a place other than a memory section on the inner surface of a silicon substrate 1 and mainly comprising a transistor and a wiring conductor is configured in addition to the memory section (portions represented by symbols 4 to 13) shown in the first embodiment. A plurality of wiring conductors for electrically connecting elements and a plurality of wiring layers comprising plugs of the wiring conductors are formed on the memory section and the logic section. However, a section formed on a place other than the memory section is not restricted to the logic section. For example, it is permitted to form a peripheral circuit for controlling inputs/outputs of a memory.

In the logic section, a transistor is formed. A plug 106 covered with barrier metals 108a and 108b is connected to a diffusion layer of the transistor and thereby the transistor is connected to a wiring conductor 107. Moreover, an interlayer insulator film 8 is formed on the transistor, the wiring conductor and the portion on which a plug to be connected with an upper element is formed.

Barrier metals 113a, 113b, 114a, and 114b, a plug 111, and a wiring conductor 112 are formed in a via hole and a wiring groove formed on the interlayer insulator film 8. Moreover, an interlayer insulator film 25 is further formed on the above, and barrier metals 123a, 123b, 124a, and 124b, a plug 121, and a wiring conductor 122 are formed on the portions on which the via hole and the wiring conductor groove are formed. The wiring conductor and the plug are formed as a plurality of layers, and the uppermost layer is covered with a protective film 27.

In case of this embodiment, a lower electrode 13 and barrier metals 113a, 113b, and 114b or an upper electrode 11 and the barrier metal 114a adopt the same element as their main component element. Specifically, the material is made of one of ruthenium (Ru), platinum (Pt), and iridium (Ir), or an alloy obtained by adding palladium (Pd), cobalt (Co), nickel (Ni), or titanium (Ti) to these noble metal elements by 0.14 to 25 at. % or more, or ruthenium oxide or iridium oxide. Moreover, these elements are formed into films through the sputtering method, the chemical vapor deposition method, or the vacuum evaporation method.

The steps of manufacturing the storage capacitor 10 of the memory section, the wiring conductor 112 and the plug 111 of the logic section of the semiconductor device of this embodiment are performed as described below.

(1) Elements located at the lowermost layer of an isolation film (not illustrated), a transistor, plugs (4 and 6), a bit line 7, a wiring conductor 107, a plug 106, and barrier metals 109a, 109b, 108a, and 108b of the wiring conductor 107 and plug 106 are formed on the main plane of the silicon substrate 1 (element forming step), and then, an interlayer insulator film 8 (interlayer insulator film forming step) is formed. Thereafter, holes for forming the storage capacitor 10 of the memory section and holes for forming the wiring conductor 112 and the plug 111 of the logic section are formed (hole forming step) (FIG. 7A).

(2) The lower electrode 13 of the storage capacitor 10 and barrier metals (113a, 113b, and 114b) of the wiring conductor 112 and plug 111 are formed as films through the sputtering method or the chemical vapor deposition method (first film-forming step). Extra films formed out of holes are removed through the chemical mechanical polishing (CMP) method or the like (FIG. 7B).

(3) The wiring conductor 111 and plug 112 are formed as films on the barrier metals 113a, 113b, and 114b (wiring conductor and plug forming step). The films are formed through the electrolytic plating method and then flattened through the CMP or the like (FIG. 7C).

(4) The dielectric film 12 is formed on the lower electrode 13 of the storage capacitor 10 through the sputtering method or the chemical vapor deposition method (dielectric-film forming step) and then, unnecessary portions are removed (FIG. 8A). It is permitted to execute this step before the step (3).

(5) The upper electrode 11 of the storage capacitor 10 and the wiring barrier metal 114a are formed as films (second-film forming step). The films are formed through the sputtering method or the chemical vapor deposition method and then unnecessary portions are removed (FIG. 8B).

(6) After forming the interlayer insulator film 25, a wiring groove and a through hole are formed to form the barrier metals 23a, 23b, 24b, 123a, 123b, and 124b, form the plugs 21 and 121 and wiring conductors 22 and 122, and moreover form the barrier metals 24a and 124a (FIG. 8C).

(7) The step (6) is repeated by a necessary number of times to form a portion to be electrically connected with an external unit and then the portion is covered with the protective film 27 (FIG. 6).

The semiconductor device manufacturing process of this embodiment is described only for showing that it is possible to simultaneously form the lower electrode 13 and barrier metals 113a, 113b, and 114b or the upper electrode 11 and the barrier metal 114a, not for restricting the semiconductor device manufacturing process to the above process.

According to this embodiment, the following functions and advantages can be expected in addition to the functions and the advantages described for the first embodiment.

According to this embodiment, it is possible to simultaneously form the lower electrode 13 of the memory section and the barrier metals 113a, 113b, and 114b of the logic section, or the upper electrode 11 of the memory section and the barrier metal 114a of the logic section as films because the electrode 13 and the barrier metals 113a, 113b, and 114b, or the electrode 11 and the barrier metal 114a are respectively made of the same material. Therefore, an advantage is obtained that it is possible to effectively use a material to be formed into a film on the entire surface of a substrate.

The semiconductor device of this embodiment is a semiconductor device in which at least one of electrode films of a storage capacitor and at least some of Cu wiring barrier metals are configured by a film adopting the same element as a main component element. However, a structure of a storage capacitor and a position of a Cu wiring conductor are not restricted to this embodiment.

Moreover, it is not always necessary that a barrier metal using an element configuring an electrode film of a storage capacitor as a main component element in the semiconductor device manufacturing method of this embodiment is the barrier metal of the portion shown for this embodiment.

Furthermore, in case of the semiconductor device of this embodiment, though the wiring conductor 112 and its plug 111 are formed on the interlayer insulator film 8 of the logic section, it is also permitted that only the plug 111 is formed on the film 8 without the restriction to this embodiment. Furthermore, a diffusion layer of a transistor formed on the substrate 1 may be directly connected to the plug 111 of the wiring conductor 112. Furthermore, though a wiring conductor using Cu or a Cu alloy for a main conductive film and its plug are covered with a barrier metal, it is not always necessary that the entire surfaces of them are covered. For example, it is permitted that the barrier metals 114a and 124a can not be formed.

According to the present invention, the reliability of a semiconductor device can be improved and it is possible to simplify the manufacturing process and reduce the material cost.

What is claimed is:

1. A semiconductor device comprising:
   a semiconductor substrate;
   a storage capacitor formed on a main surface side of the semiconductor substrate and being provided with a first electrode and a second electrode arranged so as to put a capacitor insulation film between them;
   a wiring conductor formed on the main surface side of the semiconductor substrate and including copper (Cu); and
   a first film formed on a surface of the wiring conductor, wherein
       a material configuring the first film and a material configuring the first electrode each include ruthenium as a main element.

2. A semiconductor device comprising:
   a silicon substrate;
   a storage capacitor formed on a main surface side of the silicon substrate and being provided with an upper electrode and a lower electrode arranged so as to put a capacitor insulation film between them;
   a wiring conductor formed on the main surface side of the silicon substrate and including copper (Cu) as the main element; and
   a barrier metal provided so as to contact with a surface of the wiring conductor, wherein
       the main element of a material configuring the barrier metal and the main element of a material configuring at least one of the upper electrode and the lower electrode is ruthenium.

3. A semiconductor device comprising:
   a semiconductor substrate;
   a storage capacitor formed on a main surface side of the semiconductor substrate and being provided with an upper electrode and a lower electrode arranged so as to put a capacitor insulation film between them;
   a wiring conductor formed on the main surface side of the semiconductor substrate and including copper (Cu) as the main element; and
   a barrier metal provided so as to contact with a surface of the wiring conductor, wherein
       the upper electrode extends over an area in which the opposing lower electrode exists;
       the main element of a material configuring the barrier metal and the main element of a material configuring the upper electrode is ruthenium; and
       the barrier metal contacts with the upper electrode in an upper electrode extending area out of the opposing lower electrode existing area.

4. A semiconductor device comprising:
   a semiconductor substrate;
   a storage capacitor formed on a main surface side of the semiconductor substrate and being provided with a first electrode and a second electrode arranged so as to put a capacitor insulation film between them;
   a wiring conductor formed on the main surface side of the semiconductor substrate and including copper (Cu); and
   a barrier metal provided so as to contact with a surface of the wiring conductor; wherein
       the shortest distance between the semiconductor substrate and the first electrode is shorter than the shortest distance between the semiconductor substrate and the second electrode;
       the second electrode extends over an area in which the opposing first electrode exists;
       the main element of a material configuring the barrier metal and the main element of a material configuring the second electrode is ruthenium; and
       the wiring conductor contacts with the second electrode in a second electrode extending area out of the opposing first electrode existing area.

5. The semiconductor device according to claim 1, wherein
   the capacitor insulation film is configured by a material selected from the group of strontium titanate ($SrTiO_3$), barium strontium titanate ((Ba, Sr) $TiO_3$: BST), lead zirconate titanate (Pb(Zr, Ti) $O_3$: PTZ) and bismuth layered compound (SBT).

6. A semiconductor device according to claim 1, wherein the first electrode is an upper electrode of the storage capacitor and wherein the first film is formed between the wiring conductor and the first electrode.

7. A semiconductor device according to claim 6, further comprising a second film formed on an upper surface of the wiring conductor, separated from the first electrode by the wiring conductor, wherein the material configuring the second film includes ruthenium as a main element.

8. A semiconductor device according to claim 2, wherein the barrier metal is provided between the wiring conductor and the upper electrode of the storage capacitor.

9. A semiconductor device according to claim 2, wherein the barrier metal is provided on an upper surface of the wiring conductor, separated from the upper electrode of the storage capacitor by the wiring conductor.

10. A semiconductor device according to claim 8, further comprising a second barrier metal provided on an upper surface of the wiring conductor, separated from the upper electrode of the storage capacitor by the wiring conductor, wherein the material configuring the second barrier metal includes ruthenium as a main element.

11. A semiconductor device comprising:
    a semiconductor substrate;
    a storage capacitor formed on a main surface side of the semiconductor substrate, which comprises a first electrode, a second electrode, and a capacitor insulation film disposed therebetween; and
    a logic circuit formed on the main surface side of the semiconductor substrate, which comprises a wiring conductor and a transistor communicated with the wiring conductor, wherein
        said wiring conductor includes copper and comprises a first film disposed between the wiring conductor and an interlayer insulation film formed around the wiring conductor, and wherein
        the main element of the first film material and the main element of at least one of the first and the second electrode materials is ruthenium.

12. A semiconductor device comprising:
    a semiconductor substrate;
    a storage capacitor formed on a main surface side of the semiconductor substrate, which comprises a first electrode, a second electrode, and a capacitor insulation film disposed therebetween; and
    a logic circuit formed on the main surface side of the semiconductor substrate, which comprises a wiring conductor and a transistor communicated with the wiring conductor, wherein
        said wiring conductor includes copper as a main element and comprises a first film disposed between the wiring conductor and an interlayer insulation film formed around the wiring conductor, and wherein the main element of the first film material and the same main element as at least one of the first and the second electrode materials is ruthenium.

13. A semiconductor device comprising:

a semiconductor substrate;

a storage capacitor formed on a main surface side of the semiconductor substrate, which comprises an upper electrode, a lower electrode, and a capacitor insulation film disposed therebetween; and a logic circuit formed on the main surface side of the semiconductor substrate, which comprises a wiring conductor and a transistor communicated with the wiring conductor, wherein said wiring conductor includes copper as a main element and comprises a barrier metal disposed between the wiring conductor and an interlayer insulation film formed around the wiring conductor, and wherein said upper electrode is formed beyond an area in which said lower electrode exists, and the main element of the upper electrode and the main element of the barrier metal material is ruthenium.

14. A semiconductor device comprising:

a silicon substrate;

a storage capacitor formed on a main surface side of the silicon substrate and being provided with an upper electrode and a lower electrode arranged so as to put a capacitor insulation film between them;

a wiring conductor formed on the main surface side of the silicon substrate and including copper (Cu) as the main element; and means, interposed between said upper electrode and said wiring conductor, for decreasing a contact resistance at a contact interface between the upper electrode and the wiring conductor wherein said means comprises a barrier metal layer interposed between the upper electrode and the wiring conductor, wherein the main element of said barrier metal layer and the main element of the upper electrode is ruthenium.

15. A semiconductor device comprising:

a silicon substrate;

a storage capacitor formed on a main surface side of the silicon substrate and being provided with an upper electrode and a lower electrode arranged so as to put a capacitor insulation film between them;

a wiring conductor formed on the main surface side of the silicon substrate and including copper (Cu) as the main element; and means, interposed between said upper electrode and said wiring conductor, for increasing resistance to electromigration between the upper electrode and the wiring conductor, wherein said means comprises a barrier metal layer interposed between the upper electrode and the wiring conductor, wherein the main element of said barrier metal layer and the main element of the upper electrode is ruthenium.

* * * * *